United States Patent
Slavov (10) Patent No.: US 8,624,390 B2
(45) Date of Patent: Jan. 7, 2014

(54) PACKAGING AN ELECTRONIC DEVICE (75) Inventor: Nedialko Slavov, Zurich (CH)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/514,610

(22) PCT Filed: Dec. 8, 2010

(86) PCT No.: PCT/EP2010/069214
§ 371 (c)(1),
(2), (4) Date: Jun. 8, 2012

(87) PCT Pub. No.: WO2011/070087
PCT Pub. Date: Jun. 16, 2011

(65) Prior Publication Data
US 2012/0261814 A1   Oct. 18, 2012

(30) Foreign Application Priority Data
Dec. 10, 2009   (EP) .................................... 09252759

(51) Int. Cl.
*H01L 23/34*   (2006.01)
(52) U.S. Cl.
USPC .... 257/724; 257/774; 257/777; 257/E23.065; 257/E21.499; 438/107; 438/109; 361/749; 361/810
(58) Field of Classification Search
USPC .......... 257/724, 774, 777, E23.065, E21.499; 438/107, 109; 361/749, 810
See application file for complete search history.

(56) References Cited

U.S. PATENT DOCUMENTS

| 6,208,521 | B1 | 3/2001 | Nakatsuka |
| 2001/0006252 | A1 | 7/2001 | Kim et al. |
| 2005/0167817 | A1* | 8/2005 | Damberg ...................... 257/698 |
| 2007/0230154 | A1 | 10/2007 | Nakayama |

FOREIGN PATENT DOCUMENTS

EP   1 119 049 A2   7/2001

OTHER PUBLICATIONS

International Search Report issued in corresponding International application No. PCT/EP2010/069214, mailed Feb. 7, 2011.
Written Opinion of the International Searching Authority issued in corresponding International application No. PCT/ EP2010/069214, mailed Feb. 7, 2011.
Scheifers, Steven M. et al., "A Novel Method of Minimizing Printed Wire Board Warpage", Motorola Technical Developments, Motorola Inc., Schaumberg, IL, US, vol. 28, Aug. 1, 1996, pp. 50-55, XP000638420, ISSN: 0887-5286.

* cited by examiner

*Primary Examiner* — Tu-Tu Ho
(74) *Attorney, Agent, or Firm* — Patent Portfolio Builders, PLLC (57) ABSTRACT An electronic device comprises a plurality of integrated circuit dies mounted on different areas of a carrier. The carrier is folded into a plurality of layers, each layer comprising one of the different areas of the carrier and one of the integrated circuit dies, such that the plurality of integrated circuit dies form a stack. Adjacent surfaces of neighboring layers are fixed together, for example by an adhesive layer, and the folded carrier and the integrated circuit dies are embedded in a molded material.

2 Claims, 11 Drawing Sheets

PACKAGING AN ELECTRONIC DEVICE

FIELD OF THE DISCLOSURE

The present disclosure relates to an electronic device and a method of manufacturing an electronic device. In particular, but not exclusively, the disclosure relates to packaging a plurality of integrated circuit dies in a single electronic device.

BACKGROUND TO THE DISCLOSURE

Figure 1:
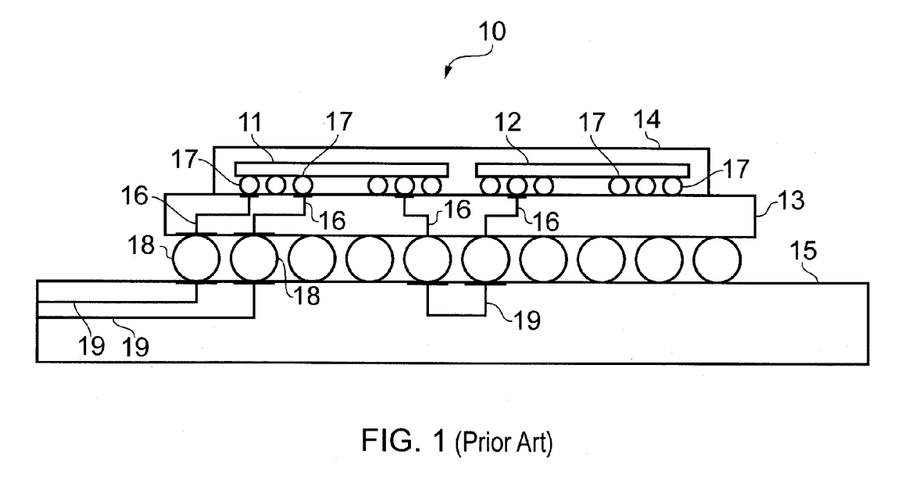
FIG. 1 is a schematic sectional view of a first example of an electronic device according to the prior art.

There are various ways of packaging a plurality of integrated circuit dies in a single electronic device. Referring to FIG. 1, in a first example according to the prior art, an electronic device 10 comprises first and second integrated circuit dies 11, 12 mounted side by side on a substrate 13. The first and second integrated circuit dies 11, 12 are provided on the substrate 13 in a housing 14 and the substrate 13 is mounted on a printed circuit board (PCB) 15.

Electrically conductive elements 16 extend through the substrate 13 from a surface of the substrate 13 facing the first and second integrated circuit dies 11, 12 to a surface of the substrate 13 facing the PCB 15. Electrically conductive bumps 17 are provided on surfaces of the first and second integrated circuit dies 11, 12 facing the substrate 13 and the first and second integrated circuit dies 11, 12 are positioned such that the electrically conductive bumps 17 are each in contact with a respective one of the electrically conductive elements 16. The substrate 13 has solder balls 18, forming a so-called ball grid array, on the surface of the substrate 13 facing the PCB 15, the solder balls 18 each being in contact with a respective one of the electrically conductive elements 16. The PCB 15 has electrically conductive tracks 19 and the substrate 13 and the PCB 15 are positioned such that the solder balls 18 are each in contact with a respective one of the electrically conductive tracks 19. Some of the electrically conductive tracks 19 of the PCB 15 are arranged to couple the first and second integrated circuit dies 11, 12 to other electronic devices (not shown) and others are arranged to couple the first and second integrated circuit dies 11, 12 to one another. Only a subset of the electrically conductive elements 16 and electrically conductive tracks 19 typically required are shown in FIG. 1 for clarity.

A problem with the electronic device 10 shown in FIG. 1 is that placing the first and second integrated circuit dies 11, 12 side by side increases the width of the electronic device 10. In particular, increases in the size of the substrate 13 and the PCB 14 increase the size and cost of the electronic device 10 such that the electronic device 10 is not suitable for many applications.

Figure 2:
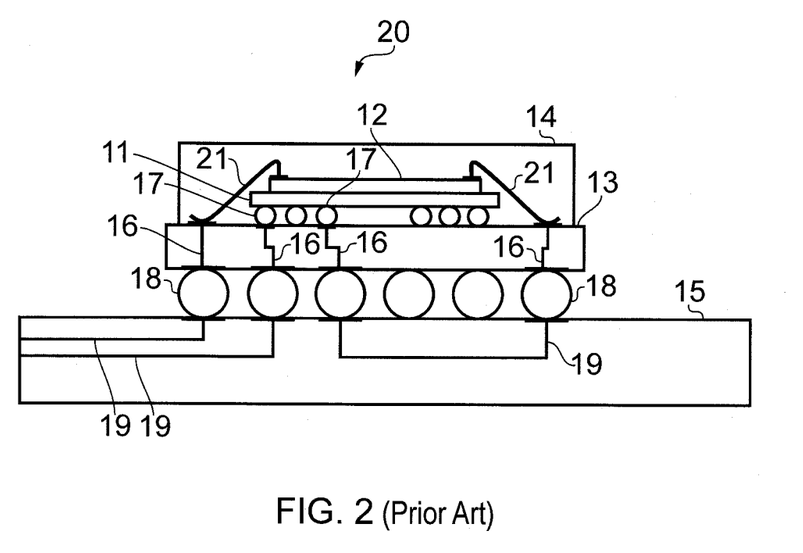
FIG. 2 is a schematic sectional view of a second example of an electronic device according to the prior art.

Referring to FIG. 2, in a second example according to the prior art, an electronic device 20 similar to the electronic device 10 of the first example has the second integrated circuit die 12 mounted on top of the first integrated circuit die 11. In other words, the first integrated circuit die 11 is mounted on the substrate 13 and the second integrated circuit die 12 is mounted on a surface of the first integrated circuit die 11 facing away from the substrate 13. For the second integrated circuit die 12, instead of the electrically conductive bumps 17 being provided on the surface facing the substrate 13, wires 21 are provided that extend from the surface facing away from the substrate 13 to the electrically conductive elements 16 of the substrate 13. This allows the first and second integrated circuit dies 11, 12 to be packaged in the electronic device 20 without any a significant increase in the width of the electronic device 20. However, the coupling of the second integrated circuit 12 to the conductive elements 16 of the substrate 13 by the wires 21 is not ideal. Provision of the wires 21 typically involves slower and more expensive manufacturing processes than providing the electrically conductive bumps 17. The length of the electrical path provided by the wires 21 is typically much longer than the length of the electrical path provided by the electrically conductive bumps 17, which means that the electrical performance of components coupled by the wires 21 is reduced. Also, the electrically conductive bumps 17 tend to provide improved thermal conductivity in comparison to the wires 21, with the result that the first and second integrated circuit dies 11, 12 can be cooled more effectively when the electrically conductive bumps 17 are used for electrical coupling rather than the wires 21.

Figure 3:
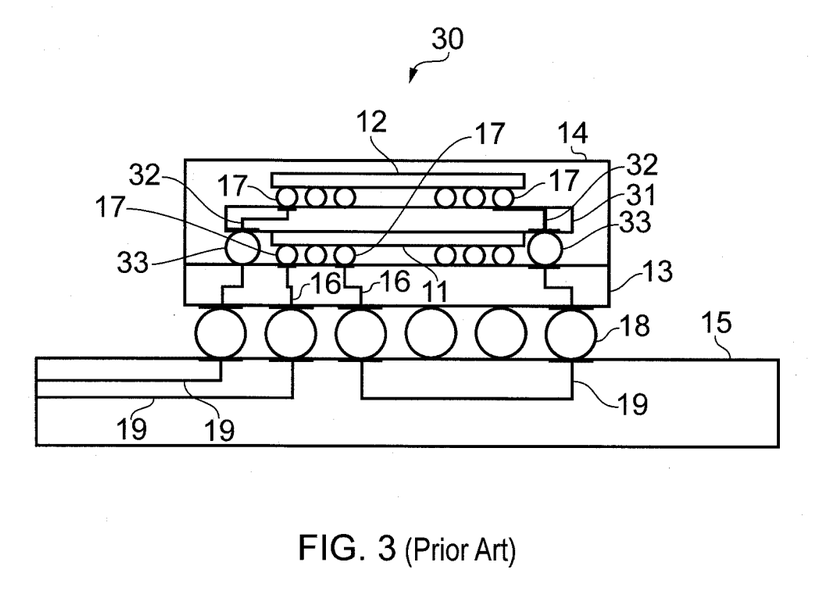
FIG. 3 is a schematic sectional view of a third example of an electronic device according to the prior art.

Referring to FIG. 3, in a third example according to the prior art, an electronic device 30 similar to the electronic device 20 of the second example has the second integrated circuit die 12 mounted on an additional substrate 31 between the first and second integrated circuit dies 11, 12. In other words, the second integrated circuit die 12 is mounted on the additional substrate 31 and the additional substrate 31 is mounted on the surface of the first integrated circuit die 11 facing away from the substrate 13. This allows the second integrated circuit die 12 to retain its electrically conductive bumps 17, as in the first example. The additional substrate 31 has electrically conductive elements 32 extending through it from a surface of the additional substrate 31 facing the second integrated circuit die 12 to a surface of the additional substrate 31 facing the substrate 13 of the electronic device 30 that is also present in the first and second examples, now referred to as the main substrate 13. Additional solder balls 33 are provided on the surface of the additional substrate 31 facing the main substrate 13. The additional solder balls 33 are each in contact with a respective one of the electrically conductive elements 32 of the additional substrate 31, and the additional substrate 31 and the main substrate 13 are positioned such that the additional solder balls 33 are also in contact with the electrically conductive elements 16 of the main substrate 13. A problem with the electronic device 30 of the third example is that the provision of the additional substrate 31 adds to the expense of the electronic device 30. The size of the electronic device 30 is also increased by the provision of the additional solder balls 33 and the additional substrate 31 and, in particular, the height of the electronic device 30 may not therefore be acceptable in some applications.

SUMMARY OF THE PREFERRED EMBODIMENTS

According to a first aspect, there is provided an electronic device comprising a plurality of integrated circuit dies mounted to different areas of a carrier, wherein the carrier is folded into a plurality of layers such that the plurality of integrated circuit dies form a stack.

According to a second aspect, there is provided a method of manufacturing an electronic device, comprising: mounting a plurality of integrated circuit dies on different areas of a carrier; and folding the carrier into a plurality of layers such that the plurality of integrated circuit dies form a stack.

By mounting a plurality of integrated circuit dies on a single carrier and folding the carrier to form an electronic device, the electronic device can be formed that has a minimal size. The use of a single carrier also minimises costs.

The plurality of integrated circuits dies may be mounted on the carrier in a variety of ways. However, it is preferable that the all of the integrated circuit dies are mounted on the same surface of the carrier. This feature enables straightforward manufacture, for example by allowing the integrated circuit dies to be mounted on the carrier straightforwardly prior to folding. Electrical contact between the integrated circuit dies and the carrier can also be made more straightforwardly than if the integrated circuit dies are provided on different sides of the carrier, as by mounting the integrated circuit dies on only one side of the carrier, the carrier can have electrical contacts for the integrated circuit dies on only that side.

One or more layers of the stack may include more than one integrated circuit die. However, preferably, each layer comprises only one of the different areas of the carrier and one of the plurality of integrated circuit dies. Each layer therefore has only a single integrated circuit die. This minimises the size and complexity of the electronic device by eliminating any spaces between different integrated circuit dies within a given layer.

Typically, the different areas of the carrier comprise a first portion and one or more further portions extending from the first portion, each of the further portions being folded over the first portion. The method can comprise folding the one or more further portions extending from the first portion over the first portion. In other words, all but one of the different areas of the carrier to which one of the plurality of integrated circuit dies are mounted may be folded over the one of the areas. Typically, the folding over comprises folding at least partially over or on top of, although it may comprise simply folding so as to overlap or completely overlap. The folding over may not be such that the portions are immediately over one another; there may be intervening layers.

In one example, the further portions extend from the first portion in different directions. The first portion may be central in relation to the further portions prior to the folding. In particular, each of the further portions may extend from the first portion in a different direction. This may mean that the folds extend in different directions or that each of the folds extends in a different direction. This allows convenient layout of the integrated circuit dies on the carrier.

In particular, the dies may be arranged on the carrier on either side or around the first portion. For example, the first portion and further portions may be arranged in a line. Alternatively, they may be arranged in a two dimensional configuration. In a particular example, the further portions may be angularly spaced from one another by the same angle. In this or other examples, the further portions may be angularly spaced from one another by an angle that is 180°, 90°, 60° or 45°.

The carrier may be folded in a variety of different ways. For example, one of the further portions may first be folded over another of the further portions and then both of these portions may be folded over the first portion. So, there may be two or more folds between the first portion and the one of the further portions. However, it is preferred that the carrier only has one fold between the first portion and each of the further portions. This is helpful for minimising the length of the carrier between pairs of the plurality of integrated circuit dies. If the pairs of integrated circuit dies are electrically coupled via the carrier, the length of the electrical coupling provided by the carrier can also be minimised in this way.

Indeed, it is preferred that the carrier comprises an electrical coupling means, and one or more of the integrated circuit dies is mounted on the carrier such that it is electrically coupled to the electrical coupling means. It is particularly preferred that at least one of the integrated circuit dies is mounted on the carrier with an electrically conductive protrusion for electrically coupling the integrated circuit die externally to the integrated circuit die facing the carrier. The electrically conductive protrusion may be coupled, or in contact with, the electrical coupling means of the carrier.

The carrier may be mounted on a substrate, and the method may comprise mounting the carrier on the substrate. It is preferred that the substrate is stiffer than the carrier. Thus, whilst the carrier may be flexible, at least prior to folding, the electronic device, as a whole, may be relatively rigid.

It is preferred that the substrate has a balancing layer. More specifically, in one example, the carrier may comprise a first material of a first thickness and may be mounted on a first surface of the substrate, and a balancing layer comprising a second material of a second thickness may be mounted on a second surface of the substrate opposite to the first surface, wherein the first and second materials and the first and second thicknesses are respectively substantially the same as one another. A part of the carrier mounted to the substrate, the substrate itself and the balancing layer may therefore have a plane of symmetry at a plane mid-way between the two surfaces of the substrate, or at least a point of symmetry. Any strain exerted on the substrate by the carrier and the balancing layer may therefore be substantially the same.

Typically, the electronic device is mounted on a printed circuit board or such like. The electronic device may be electrically coupled to the printed circuit board or such like via the substrate. So, the substrate may comprise an electrical coupling means and the carrier may be mounted on the surface of the substrate such that the electrical coupling means of the substrate is electrically coupled to the electrical coupling means of the carrier.

The electronic device may be provided as an integral device. In one example, a surface of one of the plurality of layers and a surface of another of the plurality of layers are fixed together, the two surfaces being adjacent to and facing one another. Optionally, the carrier and the plurality of integrated circuit dies can be embedded in a moulded housing. Likewise, the method can comprise moulding a material around the carrier and the plurality of integrated circuit dies such that the carrier and the plurality of integrated circuit dies are embedded in a moulded housing. The moulded housing and the substrate may together enclose the carrier and plurality of integrated circuit dies. This feature enables the electronic device to be robust.

The method of manufacturing an electronic device preferably comprises: providing a sheet of substrate material; forming a gap in the sheet of substrate material; applying a sheet of carrier material to the sheet of substrate material extending over and beyond the gap; and dividing the sheet of substrate material and the sheet of carrier material along a plane passing through the gap, thereby forming the carrier and the substrate, one of the different areas of the carrier being in a region where the sheet of carrier material extends beyond the gap, and one of the different areas of the carrier being in a region where the sheet of carrier material extends over the gap. Preferably, the method is carried out in this order, but this is not essential. This feature facilitates manufacture of the electronic device, and in particular enables a plurality of the electronic devices to be manufactured simultaneously from the same sheet of carrier material and the same sheet of substrate material.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 4:
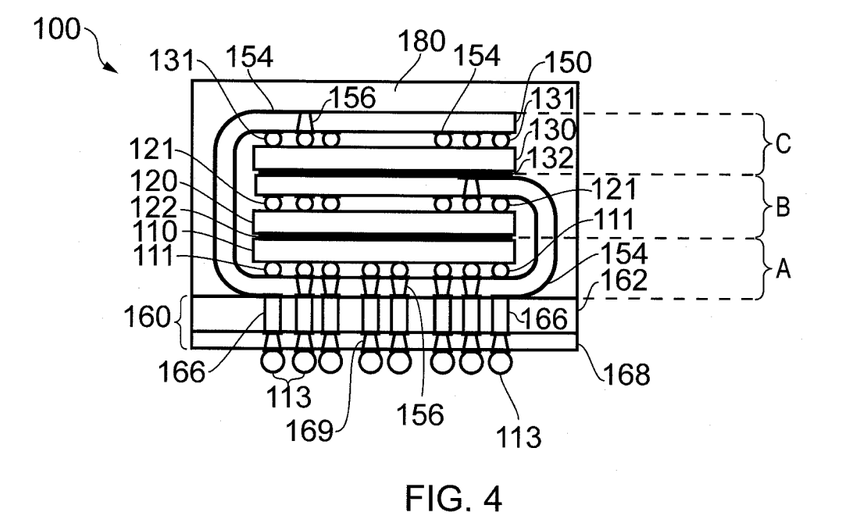
FIG. 4 is a schematic sectional view of an electronic device according to an embodiment of the present disclosure.
Figure 5:
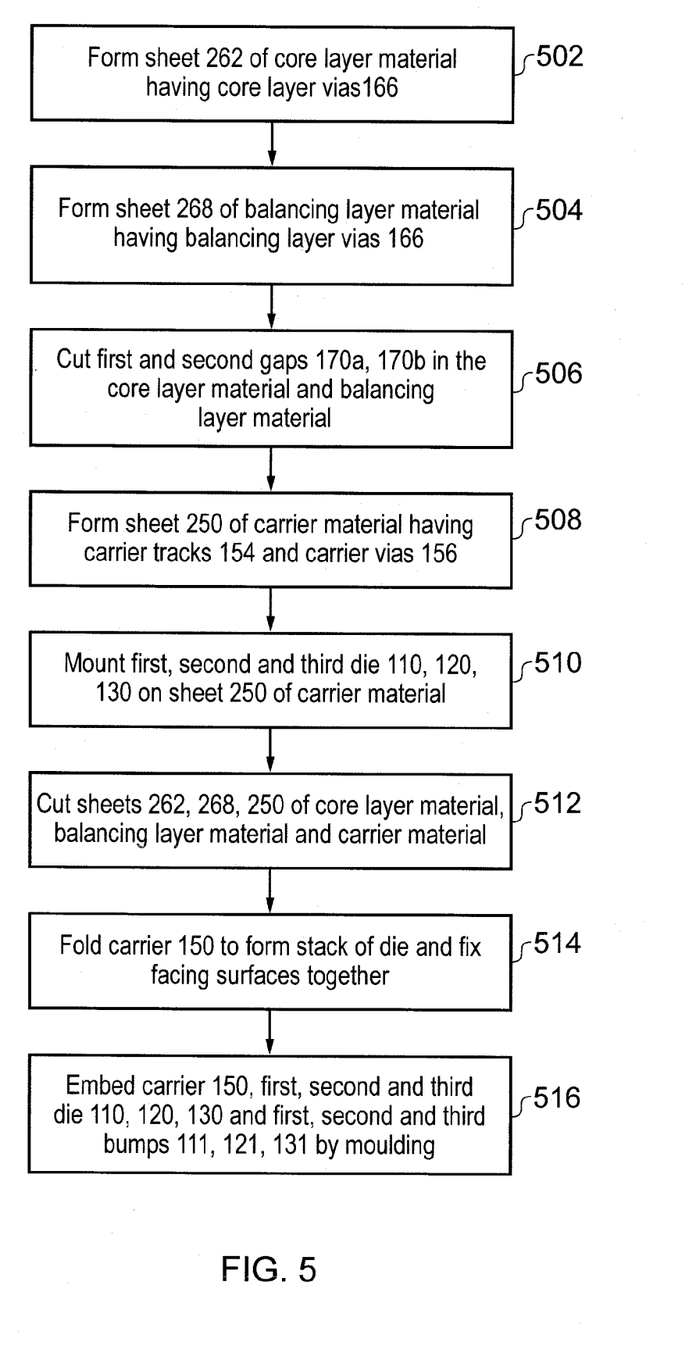
FIG. 5 is a flow chart illustrating the steps of manufacturing the electronic device shown in FIG. 4.

Referring to FIG. 4, an electronic device 100 comprises first, second and third integrated circuit dies 110, 120, 130 mounted on a carrier 150. The first integrated circuit die 110 has first electrically conductive bumps 111, the second integrated circuit die 120 has second electrically conductive bumps 121 and the third integrated circuit die 130 has third electrically conductive bumps 131. For conciseness, the first, second and third integrated circuit dies 110, 120, 130 are referred to as, respectively, the first, second and third dies 110, 120, 130. Likewise, the first, second and third electrically conductive bumps 111, 121, 131 are referred to as, respectively, first, second and third bumps 111, 121, 131.

In this embodiment, the first, second and third dies 110, 120 130 are flip chip devices. This means that they are connectable to the carrier 150 "face-down". More specifically, the conductive bumps 111, 121, 131 are provided on bond pads (not shown) on the surfaces of the dies 110, 120, 130 on which the electrical components of the dies 110, 120, 130 are provided and the dies 110, 120, 130 are mounted on the carrier 150 with this surface facing the carrier 150. In this embodiment, the first, second and third dies 110, 120, 130 are mounted on the carrier 150 by the first, second and third bumps 111, 121, 131 respectively. In other embodiments, different mounting means may be employed. The bumps 111, 121, 131 have any form that is electrically conductive and raised from the surface of the dies 110, 120, 130 on which they are provided. In one embodiment, the bumps 111, 121, 131 are pillars of electrically conductive material. In another embodiment, the bumps 111, 121, 131 comprise solder.

The first, second and third dies 110, 120 130 are mounted on different areas of the carrier 150, and the carrier 150 is folded into a plurality of layers A, B, C such that the first, second and third dies 110, 120, 130 form a stack. The first, second and third dies 110, 120, 130 can be of a similar size, and can be aligned in the stack, or at least to partially overlap each other in the stack. To facilitate folding, the carrier 150 comprises a carrier material 152 that is flexible, at least prior to folding. A first layer A of the plurality of layers A, B, C comprises the first die 110, the first bumps 111, and a region of the carrier 150 to which the first die 110 is mounted. A second layer B of the plurality of layers A, B, C comprises the second die 120, the second bumps 121, and a region of the carrier 150 to which the second die 120 is mounted. A third layer C of the plurality of layers A, B, C comprises the third die 130, the third bumps 131, and a region of the carrier 150 to which the third die 130 is mounted. The second layer B is folded over the first layer A, and the third layer C is folded over the second layer B and the first layer A. Adjacent ones of the plurality of layers A, B, C are fixed together by adhesive. More specifically, the first layer A is fixed to the second layer B by a first adhesive layer 122, and the second layer B is fixed to the third layer C by a second adhesive layer 132. In particular, a surface of the first die 110 opposite that on which the first bumps 111 are located is fixed by the first adhesive layer 122 to a surface of the second die 120 opposite that on which the second bumps 121 are located. Similarly, a surface of the third die 130 opposite that on which the third bumps 131 are located is fixed by the second adhesive layer 132 to the surface of the carrier 150 to which the third die 130 is mounted.

The carrier 150 comprises an electrically non-conductive material, carrier tracks 154 on one or more surfaces of the carrier 150, and carrier vias 156 through the carrier 150. The dies 110, 120, 130 are positioned on the carrier such that the electrically conductive bumps 111, 121, 131 are in contact with the carrier tracks 154 and carrier vias 156. For conciseness, wherever tracks are referred to, these are electrically conductive tracks made from, for example, a metal. In addition, wherever vias are referred to, these are electrically conductive vias.

The folded carrier 150 with the attached first, second and third dies 110, 120, 130 is mounted on a substrate 160. In this embodiment, the substrate 160 is substantially flat and the carrier 150 is folded and mounted on the substrate 160 such that the first, second and third dies 110, 120, 130 are parallel to the major plane of the substrate 160. The substrate 160 is rigid and provides support for the folded carrier 150 and the attached first, second and third dies 110, 120, 130. On a surface of the substrate 160 opposite that on which the folded carrier 150 is mounted, the substrate 160 is provided with solder balls 113, such as a ball grid array, for coupling the substrate 160 externally to the electronic device 100, e.g. to a printed circuit board (PCB) (not illustrated).

The substrate 160 comprises a core layer 162 of an electrically non-conductive core layer material and, on a surface of the core layer 162 opposite to that on which the carrier 150 is mounted, a balancing layer 168 of balancing layer material, which is the same material as the carrier material of the carrier 150. The balancing layer 168 balances the mechanical properties of the substrate 160 and the carrier 150, although in some embodiments the balancing layer 168 may be omitted. The core layer 162 has core layer vias 166 and the balancing layer 168 has balancing layer vias 169 coupled to the core layer vias 166 to provide substrate vias extending through the substrate 160. The solder balls 113 are provided on the bottom surface of the substrate 160 in contact with the balancing layer vias 169 and the carrier 150 is positioned on the substrate 160 such that appropriate ones of the carrier tracks 154 and carrier vias 156 are in contact with the core layer vias 166. So, the first, second and third dies 110, 120 130 can be coupled to each other and to devices external to the electronic device 100 by means of the first, second and third bumps 111, 121, 131 of the respective first, second and third dies 110, 120, 130, the carrier tracks 154 on one or more surfaces of the carrier material, the carrier vias 156 through the carrier 150, core layer vias 166 through the core layer 162, balancing layer vias 169 through the balancing layer 168, the solder balls 113 of the bottom surface of the substrate 160 and a PCB (not shown).

The carrier 150 and the first, second and third dies, 110, 120, 130 with their respective first, second and third bumps 111, 121, 131 are embedded in a moulded material 180. The moulded material 180 and the carrier 160 therefore enclose the carrier 150 and the first, second and third dies, 110, 120, 130 with their respective first, second and third bumps 111, 121, 131.

Figure 6A:
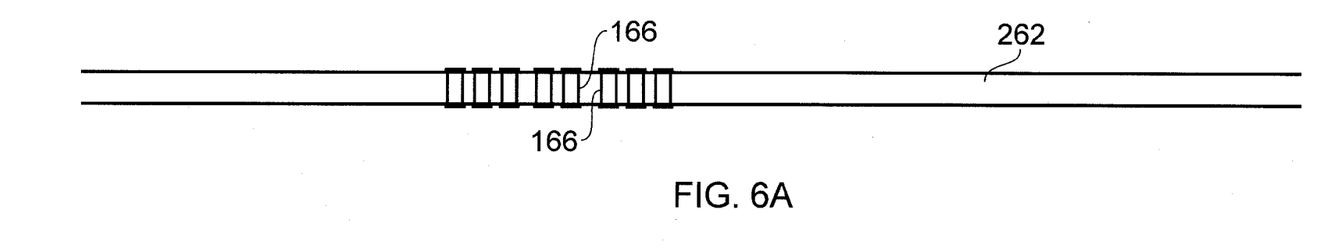
FIGS. 6A-G are schematic sectional views of the electronic device shown in FIG. 4 at successive stages of manufacture the electronic device.

Referring to FIGS. 5, 6A to 6G and 7, manufacture of the electronic device 100 described with reference to FIG. 4 commences at step 502 by forming a sheet 262, or panel, of the electrically non-conductive core layer material. Also at step 502, the core layer vias 166 are formed, for example from a metal, through the sheet 262 of core layer material, as illustrated in FIG. 6A.

Figure 6B:
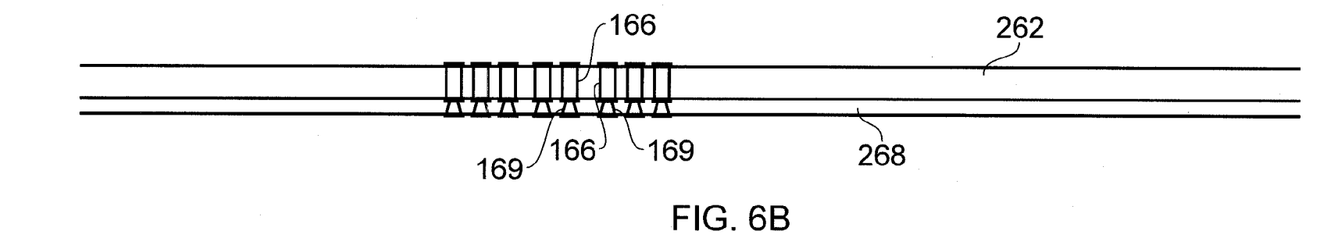

At step 504, a sheet 268 of the balancing layer material 268 is formed on a first surface of the sheet 262 of the core layer material, which is the bottom surface in FIG. 6A, and the balancing layer vias 169 are formed through the sheet 268 of balancing layer material, as illustrated in FIG. 6B. The balancing layer vias 169 and the core layer vias 166 coincide with one another so as to form the substrate vias. The substrate 160, when the manufacturing process is complete, comprises a portion of the sheet 262 of the core layer material, the core layer vias 166, a portion of the sheet 268 of the balancing layer material and the balancing layer vias 169.

Figure 6C:
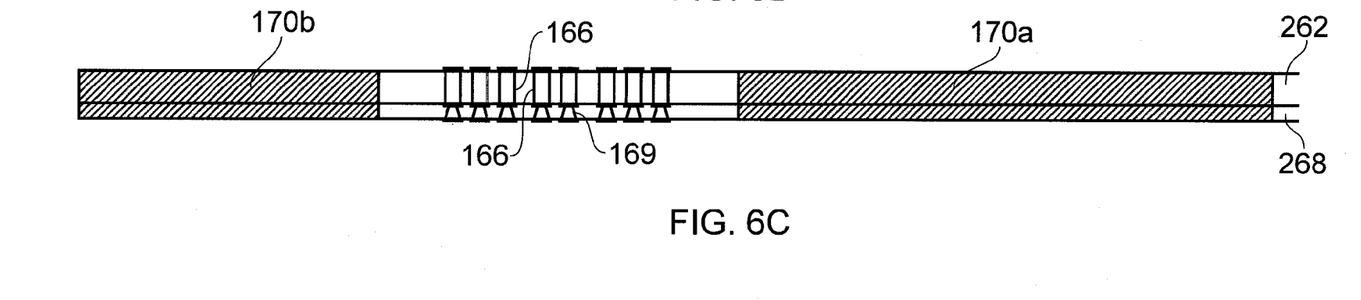

At step 506, a first gap 170a and a second gap 170b are formed in the sheet 262 of the core layer material and the sheet 268 of the balancing layer material 268 by cutting out portions of the sheet 262 of the core layer material and the sheet 268 of the balancing layer material, as illustrated in FIG. 6C. The gaps 170a, 170b extend completely through the sheet 262 of the core layer material and the sheet 268 of the balancing layer material, but the sheets 262, 268 remain intact as single sheets. In some embodiments, the first and second gaps 170a, 170b are holes, each having a complete peripheries in the sheets 262, 268 of the core layer material and balancing layer material.

Figure 6D:
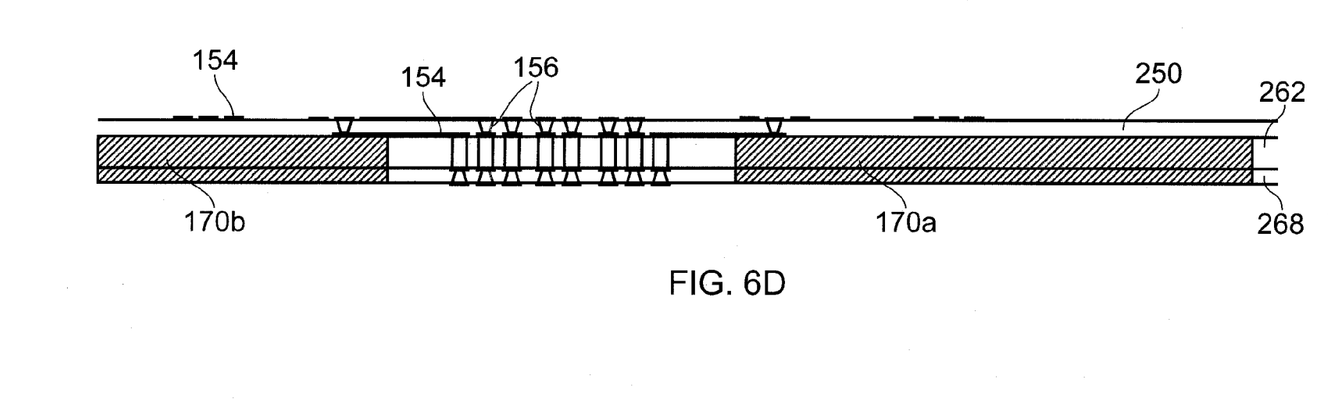

At step 508, a sheet 250, or panel, of carrier material is formed on a second surface of the sheet 262 of the core layer material. The second surface of the sheet 262 of the core layer material is opposite the first surface of the sheet 262 of core layer material and is the top surface in FIG. 6C. The sheet 250 of carrier material covers the first and second gaps 170a, 170b. Also at step 508, the carrier conductive tracks 154 are formed on the upper and lower planar surfaces of the sheet 250 of the carrier material and the carrier conductive vias 156 are formed through the sheet 250 of the carrier material, as illustrated in FIG. 6D.

At step 510, the first, second and third dies 110, 120, 130 are mounted on the sheet 250 of the carrier material, on the opposite side of the sheet 250 of the carrier material to that facing the sheet 262 of the core layer material, by means of their respective first, second and third bumps 111, 121, 131. The first die 110 is mounted above a portion of the sheet 262 of the core layer material where no gap 170a, 170b was cut, the second die 120 is mounted over the first gap 170a to the right of the first die 110, and the third die 130 is mounted over the second gap 170b to the left of the first die 110, as illustrated in FIG. 6E.

Figure 6E:
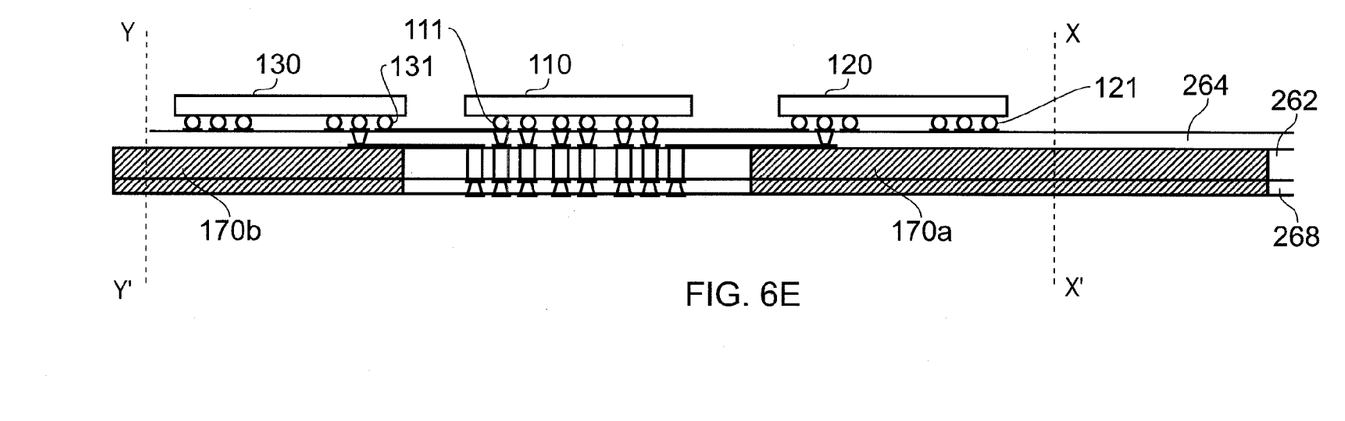

At step 512, the sheet 250 of the carrier material, the sheet 262 of the core layer material and the sheet 268 of the balancing layer material 268 are cut to the right of the second die 120 along a first plane X-X' passing vertically through the first gap 170a, and are also cut to the left of the third die 130 along a second plane Y-Y' passing vertically through the second gap 170b, as illustrated in FIG. 6E. Further cuts are made in vertical planes perpendicular to the first and second planes X-X', Y-Y' in order to release the elements required for the electronic device 100 from the sheets 250, 262, 268 of the carrier material, core layer material and balancing layer material.

Figure 6F:
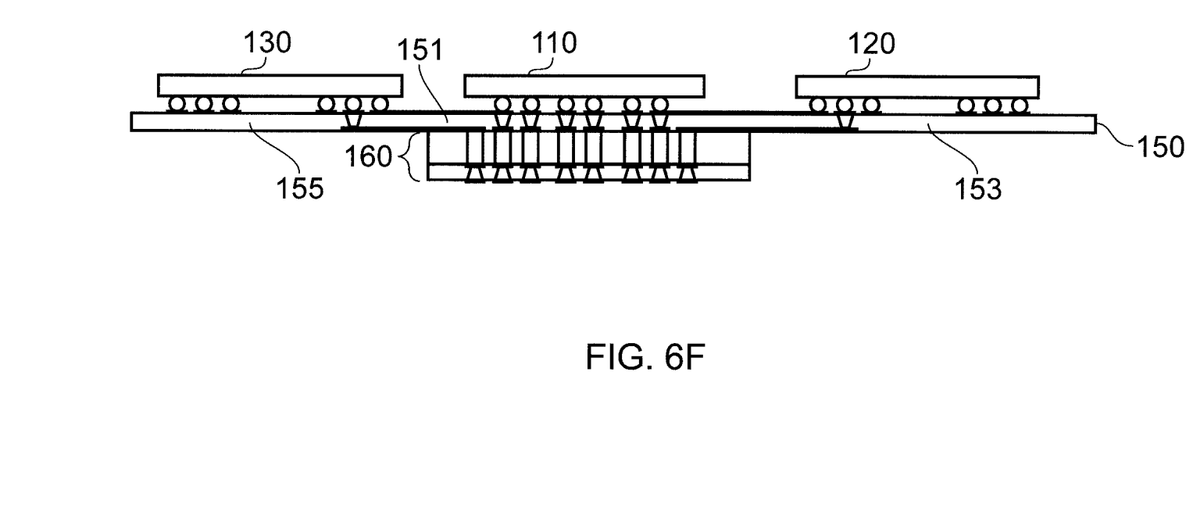
Figure 7:
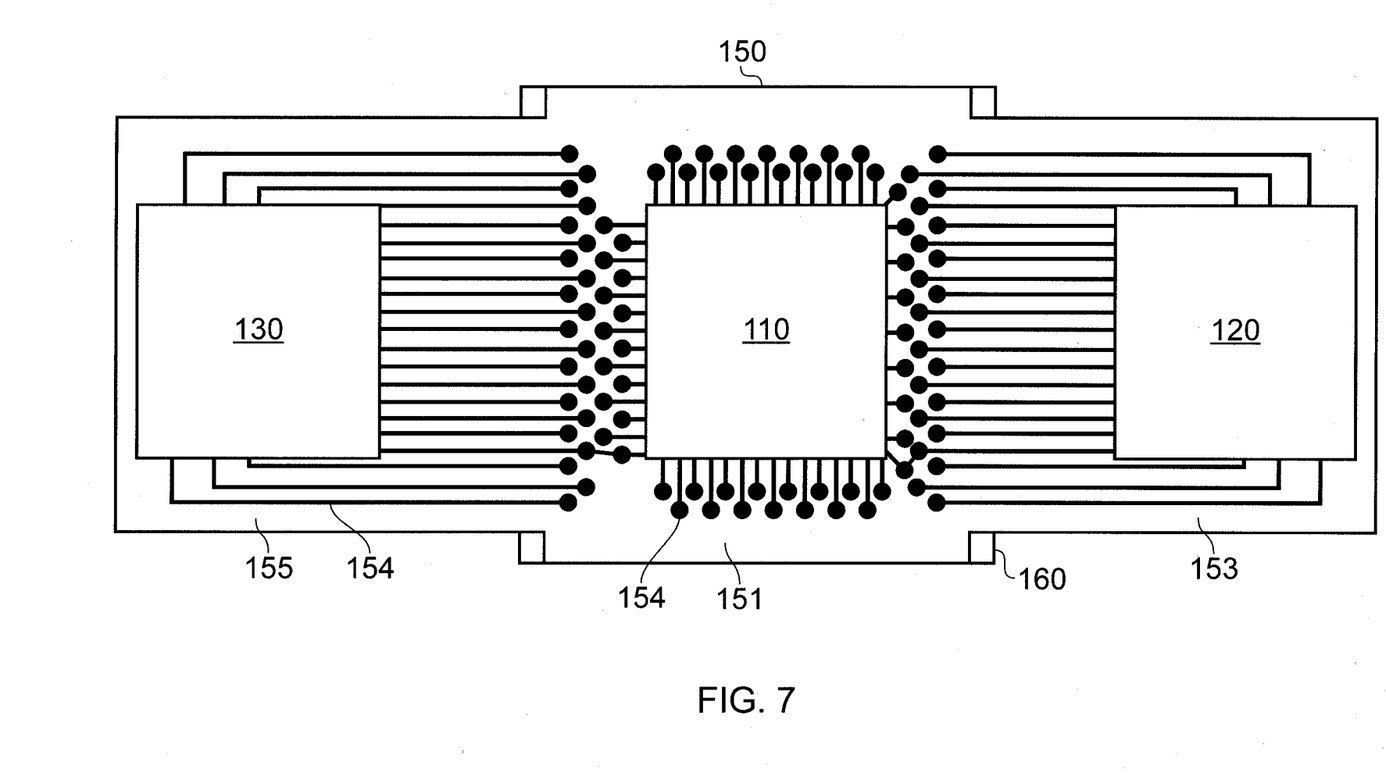
FIG. 7 is a plan view of the electronic device shown in FIG. 4 at the stage of manufacture shown in FIG. 6F.

At this stage, referring to FIG. 6F, the substrate 160 comprises a portion of the sheet 262 of the core layer material and a portion of the sheet 268 of the balancing layer material. In particular, the carrier 150 comprises a first portion 151 of the sheet 250 of the carrier material over the substrate 160, a second portion 153 of the sheet 250 of the carrier material extending to the right from the first portion 151 and which was over the first gap 170a prior to the cutting, and a third portion 155 of the sheet 250 of the carrier material 250 extending to the left from the first portion 151 and which was over the second gap 170b prior to the cutting. FIG. 7 illustrates a plan view from above of the electronic device 100 at this stage, and shows the first second and third dies 110, 120, 130 mounted on the carrier 150, which comprises the first, second and third portions 151, 153, 155 and the carrier tracks 154, and which is mounted on the substrate 160. Additional electronic devices may be cut from the laminated structure comprising the sheets 250, 262, 268 of the carrier material, core layer material and balancing layer material.

Figure 6G:
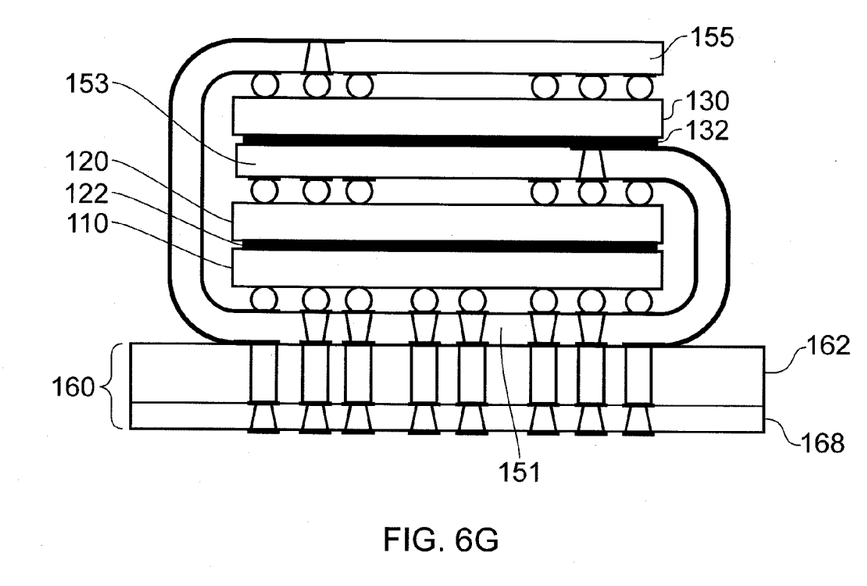

At step 514, the second portion 153 of the carrier 150 is folded over the first portion 151, thereby inverting the second die 120 and bringing the first die 110 and the second die 120 together. The facing surfaces of the first die 110 and the second die 120 are fixed together by means of the first adhesive layer 122. Then the third portion 155 of the carrier 150 is folded over the second portion 153 of the carrier 150, thereby inverting the third die 130 and bringing the third die 130 and the second portion 153 of the carrier 150 together. The facing surfaces of the third die 130 and the second portion 153 of the carrier 150 are fixed together by means of the second adhesive layer 132. FIG. 6G illustrates the unfinished assembly at this stage after the folding and application of the first and second adhesive layers 122, 132.

At step 516, the carrier 150 and the first, second and third dies, 110, 120, 130 with their respective first, second and third bumps 111, 121, 131 have a mouldable material moulded around them, thereby embedding the carrier 150 and the first, second and third dies 110, 120, 130 in the moulded material 180. The solder balls 113 are also provided on a surface of the substrate 160 facing away from the carrier 150. The resulting electronic device 100 is illustrated in FIG. 4.

Although embodiments have been described in which the first, second and third dies 110, 120, 130 are mounted on the same surface of the carrier 150, this is not essential. In other embodiments, either or both of the second and third dies 120, 130 are mounted on the opposite surface of the carrier 150 to that on which the first die 110 is mounted. In other embodiments, additional dies may be mounted on the carrier 150 on either or both of the surfaces.

Although embodiments have been described in which the carrier 150 comprises a first portion 151 and two further portions 153, 155 and involves two folds, resulting in the carrier 150 providing, after folding, the three layers A, B, C each with one of the dies 110, 120, 130, this is not essential. In other embodiments, other numbers of folds may be used. In one embodiment, an electronic device having two layers with a single fold between them is provided, one layer comprising the first portion 151 of the carrier 150 and the first die 110 and the other layer comprising one of the further portions 153, 155 and just one of the second or third ides 120, 130. In other embodiments, more than two folds are used.

Figure 8:
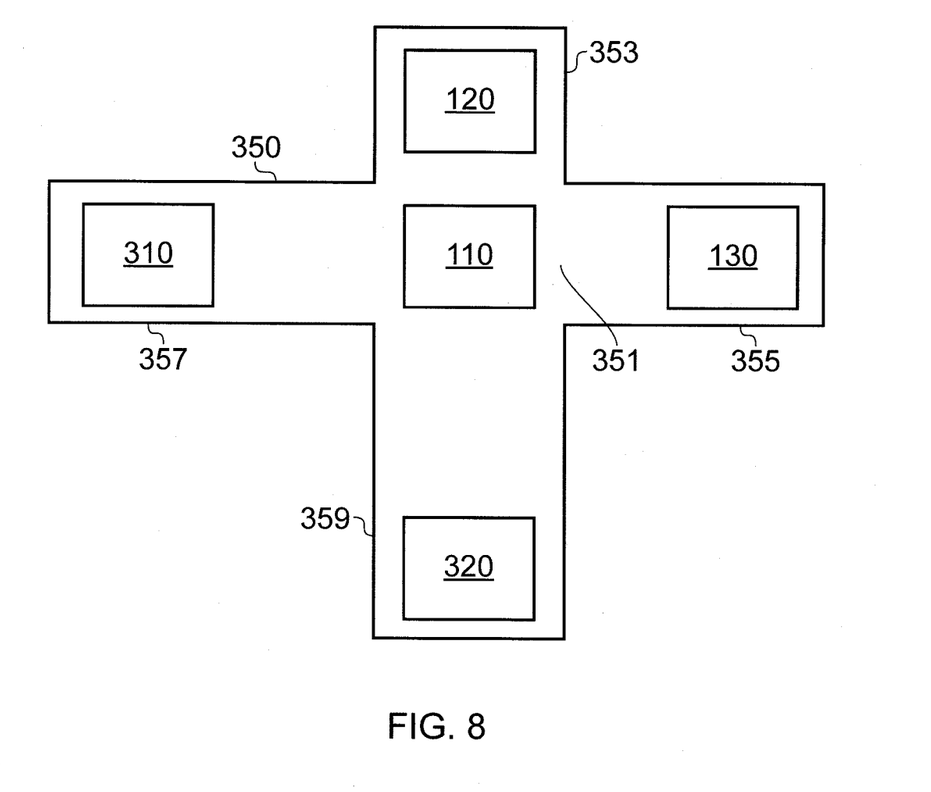
FIG. 8 is a plan view of an electronic device according to another embodiment of the present disclosure at an intermediate stage of manufacture.

FIG. 8 illustrates a carrier 350 comprising a first portion 351 having the first die 110 mounted on it, and second, third, fourth and fifth further portions 353, 355, 357 and 359 extending from the first portion 351. The second portion 353 of the carrier 350 has the second die 120 mounted on it, the third portion 355 of the carrier 350 has the third die 130 mounted on it, the fourth portion 357 of the carrier 350 has a fourth die 310 mounted on it, and the fifth portion 359 of the carrier 350 has a fifth die 320 mounted on it. The second, third, fourth and fifth portions 353, 355, 357, 359 of the carrier 350 are of different lengths to facilitate folding, with the second portion 353 being folded over the first portion 351, the third portion 355 being folded over the second portion 353, the fourth portion 357 being folded over the third portion 355, and the fifth portion 359 being folded over the fourth portion 357. After folding, the first, second, third, fourth and fifth dies 110, 120, 130, 310, 320 form a stack, and the base of the stack has a generally rectangular or square shape. In other embodiments, the carrier comprises: a first portion and three further portions, involving three folds and resulting, after folding, in a stack having a generally triangular base; a first portion and five further portions, involving five folds and resulting, after folding, in a stack having a generally pentagonal base; a first portion and six further portions, involving six folds and resulting, after folding, in a stack having a generally hexagonal base; a first portion and seven further portions, involving seven folds and resulting, after folding, in a stack having a generally heptagonal base; and a first portion and eight further portions, involving eight folds and resulting, after folding, in a stack having a generally octagonal base. To facilitate the folding, the further portions can be of different lengths.

Although embodiments of the method have been described comprising folding the carrier 150, 350, this is not essential. In other embodiments, the carrier 150, 350 is formed having a pre-folded shape.

Although embodiments have been described in which adjacent layers, comprising the carrier 150 and one of the first, second and third dies 110, 120, 130 mounted on the carrier 150, are fixed together by means of adhesive, this is not essential. In other embodiments, alternative means of fixing are employed. For example, the fixing is provided by the moulded material 180 without the use of the first or second adhesive layers 122, 132.

Suitable materials for the carrier 150, 350 are: FR4, polyimide, polytetrafluoroethylene, also known as PTFE, and polyester. In the illustrated embodiments, the carrier 150, 350 comprises a laminated material. Electronic components, particularly resistors, can be integrated in the laminated material. By way of example, if the carrier 150, 350 is made from a polyimide, the following properties are provided: a laminate structure having four layers of carrier tracks 154; a total thickness of 50 micrometers; carrier tracks 154 having line widths of 15 micometers and a line spacing of 10 micrometers; carrier vias 156 of 30 micrometers in width; and a bend radius when folded of 0.5 millimeters.

Although embodiments have been described in which the first, second and third bumps 111, 121, 131 can be made of solder, this is not essential and other materials can be used. For example, an electrically conductive adhesive can be used to mount the first, second and third dies 110, 120, 130 on the carrier 150. Such an electrically conductive adhesive is particular suitable if the carrier 150 comprises a polyester material.

Although embodiments have been described in which, after the carrier 150 has been folded to form a stack, the first, second and third dies 110, 120, 130 are disposed parallel to the surface of the substrate 160 on which the carrier 150 is mounted, this is not essential. In other embodiments, the first second and third dies 110, 120, 130 are disposed perpendicular to the surface of the substrate 160 on which the carrier 150 is mounted.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A method of manufacturing an electronic device, comprising:
   mounting a plurality of integrated circuit dies on different areas of a carrier; and
   folding the carrier into a plurality of layers such that the plurality of integrated circuit dies form a stack;
   wherein the method further comprises:
   providing a sheet of substrate material;
   forming a first gap and a second gap in the sheet of substrate material;
   applying a sheet of carrier material to the sheet of substrate material extending over and beyond the first and second gaps; and
   dividing the sheet of substrate material and the sheet of carrier material along a plane passing through the first and second gaps, thereby forming the carrier and a substrate, one of the different areas of the carrier being in a region where the sheet of carrier material extends beyond the first and second gaps, and one of the different areas of the carrier being in a region where the sheet of carrier material extends over the first and second gaps.

2. A method of manufacturing an electronic device as claimed in claim 1, the different areas of the carrier comprising a first portion and one or more further portions extending from the first portion, wherein the first portion is central in relation to the further portions prior to the folding.

* * * * *